(12) United States Patent
Lee et al.

(10) Patent No.: US 9,100,029 B2
(45) Date of Patent: Aug. 4, 2015

(54) SERIALIZERS

(71) Applicant: SK hynix Inc., Icheon-si Gyeonggi-do (KR)

(72) Inventors: Hyeng Ouk Lee, Yongin-si (KR); Sang Kwon Lee, Yongin-si (KR)

(73) Assignee: SK Hynix Inc, Gyeonggi-do (KR)

( * ) Notice: Subject to any disclaimer, the term of this patent is extended or adjusted under 35 U.S.C. 154(b) by 0 days.

(21) Appl. No.: 14/176,331

(22) Filed: Feb. 10, 2014

(65) Prior Publication Data

US 2015/0123826 A1    May 7, 2015

(30) Foreign Application Priority Data

Nov. 6, 2013    (KR) ........................ 10-2013-0134314

(51) Int. Cl.
*H03M 9/00*    (2006.01)

(52) U.S. Cl.
CPC ....................................... *H03M 9/00* (2013.01)

(58) Field of Classification Search
CPC ....................................................... H03M 9/00
USPC ............................................................ 341/101
See application file for complete search history.

(56) References Cited

U.S. PATENT DOCUMENTS

| | | | |
|---|---|---|---|
| 6,633,188 B1 | 10/2003 | Jia et al. | |
| 7,161,846 B2 * | 1/2007 | Padaparambil | 365/189.05 |
| 7,460,039 B2 * | 12/2008 | Jeon | 341/100 |
| 8,570,198 B2 * | 10/2013 | Chang | 341/101 |
| 8,624,761 B1 * | 1/2014 | Gong et al. | 341/101 |
| 8,912,933 B1 * | 12/2014 | Zhang et al. | 341/101 |
| 2006/0104124 A1 | 5/2006 | Padaparambil | |

* cited by examiner

*Primary Examiner* — Brian Young
(74) *Attorney, Agent, or Firm* — William Park & Associates Ltd.

(57) ABSTRACT

Serializers are provided. The serializer includes a first drive control signal generator and a second drive control signal generator. The first drive control signal generator amplifies a first input data signal in response to a first clock signal and a second clock signal to generate a first pull-up drive control signal and a first pull-down drive control signal. The second drive control signal generator amplifies a second input data signal in response to the second clock signal and a third clock signal to generate a second pull-up drive control signal and a second pull-down drive control signal.

20 Claims, 4 Drawing Sheets

SERIALIZERS

CROSS-REFERENCE TO RELATED APPLICATION

The present application claims priority under 35 U.S.C. 119(a) to Korean Application No. 10-2013-0134314, filed on Nov. 6, 2013, in the Korean Intellectual Property Office, which is incorporated herein by reference in its entirety as set forth in full.

BACKGROUND

1. Technical Field

Embodiments of the present disclosure generally relate to semiconductor devices and, more particularly, to serializers.

2. Related Art

In electronic devices such as semiconductor devices, electric data may be transmitted in series or in parallel. According to the serial transmission of the data, a plurality of data may be sequentially transmitted by the bit through a single transmission line. Meanwhile, according to the parallel transmission of the data, a plurality of data may be simultaneously transmitted through a plurality of transmission lines.

The serial transmission of the data may reduce the number of the transmission lines to provide some advantages in terms of fabrication cost and design margin of the semiconductor devices. However, the serial transmission of the data may exhibit a relatively low data transmission speed because the data are transmitted in series through a single transmission line. In contrast, the parallel transmission of the data may exhibit a relatively high data transmission speed because the data are simultaneously transmitted through a plurality of transmission lines. However, the parallel transmission of the data may have some disadvantages in terms of fabrication cost and design margin of the semiconductor devices because a number of transmission lines are required to simultaneously transmit a plurality of data.

In order that a transmitter capable of simultaneously sending a plurality of data transmits the plurality of data through a single transmission line, a serializer may be used to convert the data outputted in parallel from the transmitter into serial data. Further, in order that a receiver capable of simultaneously receiving a plurality of data receives the plurality of data through a single transmission line, a deserializer may be used to convert the data outputted in series from a transmitter into parallel data.

SUMMARY

Various embodiments are directed to serializers.

According to some embodiments, a serializer includes a first drive control signal generator and a second drive control signal generator. The first drive control signal generator amplifies a first input data signal in response to a first clock signal and a second clock signal to generate a first pull-up drive control signal and a first pull-down drive control signal. The second drive control signal generator amplifies a second input data signal in response to the second clock signal and a third clock signal to generate a second pull-up drive control signal and a second pull-down drive control signal.

According to further embodiments, a serailizer includes an initialization unit suitable for receiving a first clock signal and a second clock signal to initialize a first node through which a latch signal is outputted and a second node through which a complementary latch signal is outputted, a discharge unit suitable for receiving an input data signal in response to the first clock signal and the second clock signal to discharge electric charges of the first node or the second node, and a charge supply unit suitable for selectively supplying electric charges to one of the first and second nodes according to logic levels of the first and second nodes.

According to further embodiments, a serailizer includes an initialization unit configured for receiving a first clock signal and a second clock signal to initialize a first node through which a latch signal is outputted and a second node through which a complementary latch signal is outputted; and a signal output unit configured for outputting a pull-up drive control signal and a pull-down drive control signal, any one of which is selectively driven according to logic levels of the latch signal and the complementary latch signal, wherein the pull-up drive control signal and the pull-down drive control signal are generated to selectively drive an output data signal.

According to further embodiments, a system includes a controller, an integrated circuit configured to receive a signal from the controller, the integrated circuit including: a first drive control signal generator configured for amplifying a first input data signal in response to a first clock signal and a second clock signal to generate a first pull-up drive control signal and a first pull-down drive control signal; and a second drive control signal generator configured for amplifying a second input data signal in response to the second clock signal and a third clock signal to generate a second pull-up drive control signal and a second pull-down drive control signal.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Various embodiments of the present disclosure will be described more fully hereinafter with reference to the accompanying drawings. However, the embodiments described herein are for illustrative purposes only and are not intended to limit the scope of the present invention.

Figure 1:
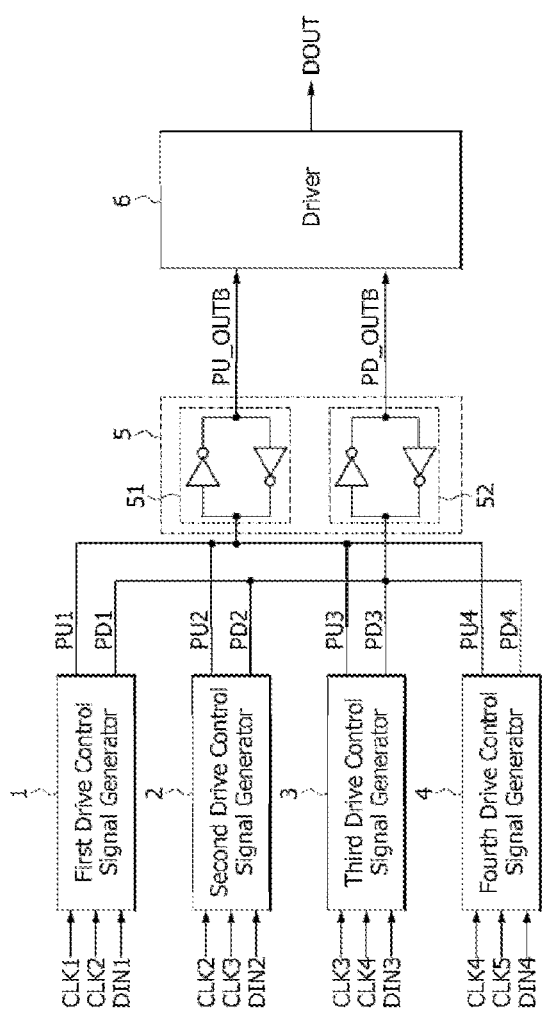
FIG. 1 is a block diagram illustrating a serializer according to some embodiments of the present disclosure.

Referring to FIG. 1, a serializer according to some embodiments may include a first drive control signal generator 1, a second drive control signal generator 2, a third drive control signal generator 3, a fourth drive control signal generator 4, an output drive signal generator 5 and a driver 6.

The first drive control signal generator 1 may amplify a first input data signal DIN1 in response to first and second clock signals CLK1 and CLK2 to generate a first pull-up drive control signal PU1 and a first pull-down drive control signal PD1. The first clock signal CLK1 may precede the second clock signal CLK2 by a phase of about 90 degrees. The phase difference between the first and second clock signals CLK1 and CLK2 may be set to be different according to the embodiments. The first drive control signal generator 1 may be designed to amplify the first input data signal DIN1 while both of the first and second clock signals CLK1 and CLK2 have a logic "high" level. Alternatively, a logic level combination of the first and second clock signals CLK1 and CLK2 for amplifying the first input data signal DIN1 may be set to be different according to the embodiments.

The second drive control signal generator 2 may amplify a second input data signal DIN2 in response to the second clock signal CLK2 and a third clock signal CLK3 to generate a second pull-up drive control signal PU2 and a second pull-down drive control signal PD2. The second clock signal CLK2 may precede the third clock signal CLK3 by a phase of about 90 degrees. The phase difference between the second and third clock signals CLK2 and CLK3 may be set to be different according to the embodiments. The second drive control signal generator 2 may be designed to amplify the second input data signal DIN2 while both of the second and third clock signals CLK2 and CLK3 have a logic "high" level. Alternatively, a logic level combination of the second and third clock signals CLK2 and CLK3 for amplifying the second input data signal DIN2 may be set to be different according to the embodiments.

The third drive control signal generator 3 may amplify a third input data signal DIN3 in response to the third clock signal CLK3 and a fourth clock signal CLK4 to generate a third pull-up drive control signal PU3 and a third pull-down drive control signal PD3. The third clock signal CLK3 may precede the fourth clock signal CLK4 by a phase of about 90 degrees. The phase difference between the third and fourth clock signals CLK3 and CLK4 may be set to be different according to the embodiments. The third drive control signal generator 3 may be designed to amplify the third input data signal DIN3 while both of the third and fourth clock signals CLK3 and CLK4 have a logic "high" level. Alternatively, a logic level combination of the third and fourth clock signals CLK3 and CLK4 for amplifying the third input data signal DIN3 may be set to be different according to the embodiments.

The fourth drive control signal generator 4 may amplify a fourth input data signal DIN4 in response to the fourth clock signal CLK4 and a fifth clock signal CLK5 to generate a fourth pull-up drive control signal PU4 and a fourth pull-down drive control signal PD4. The fourth clock signal CLK4 may precede the fifth clock signal CLK5 by a phase of about 90 degrees. The phase difference between the fourth and fifth clock signals CLK4 and CLK5 may be set to be different according to the embodiments. The fourth drive control signal generator 4 may be designed to amplify the fourth input data signal DIN4 while both of the fourth and fifth clock signals CLK4 and CLK5 have a logic "high" level. Alternatively, a logic level combination of the fourth and fifth clock signals CLK4 and CLK5 for amplifying the fourth input data signal DIN4 may be set to be different according to the embodiments.

The output drive signal generator 5 may be configured to include a first latch unit 51 and a second latch unit 52. The first latch unit 51 may buffer one of the first to fourth pull-up drive control signals PU1, PU2, PU3 and PU4 to generate an output pull-up drive signal PU_OUTB. The first latch unit 51 may latch the output pull-up drive signal PU_OUTB. The second latch unit 52 may buffer one of the first to fourth pull-down drive control signals PD1, PD2, PD3 and PD4 to generate an output pull-down drive signal PD_OUTB. The second latch unit 52 may latch the output pull-down drive signal PD_OUTB. Specifically, the output drive signal generator 5 may generate and latch the output pull-up drive signal PU_OUTB enabled to have a logic "low" level if the first pull-up drive control signal PU1 having a logic "high" level is generated from the first input data signal DIN1 having a logic "high" level while both of the first and second clock signals CLK1 and CLK2 have a logic "high" level. Further, the output drive signal generator 5 may generate and latch the output pull-down drive signal PD_OUTB enabled to have a logic "low" level if the third pull-down drive control signal PD3 having a logic "high" level is generated from the third input data signal DIN3 having a logic "low" level while both of the third and fourth clock signals CLK3 and CLK4 have a logic "high" level.

The driver 6 may drive an output data signal DOUT in response to the output pull-up drive signal PU_OUTB and the output pull-down drive signal PD_OUTB. Specifically, the driver 6 may drive the output data signal DOUT to have a logic "high" level and may output the output data signal DOUT driven to have a logic "high" level if the output pull-up drive signal PU_OUTB enabled to have a logic "low" level is inputted thereto. Further, the driver 6 may drive the output data signal DOUT to have a logic "low" level and may output the output data signal DOUT driven to have a logic "low" level if the output pull-down drive signal PD_OUTB enabled to have a logic "low" level is inputted thereto.

According to the embodiment set forth above, the first to fourth drive control signal generators 1, 2, 3 and 4 may share the single driver 6 to reduce a layout area and current consumption of the serializer. In addition, the output data signal DOUT may be outputted only through the driver 6. Thus, a signal characteristic of the output data signal DOUT may be improved.

Figure 2:
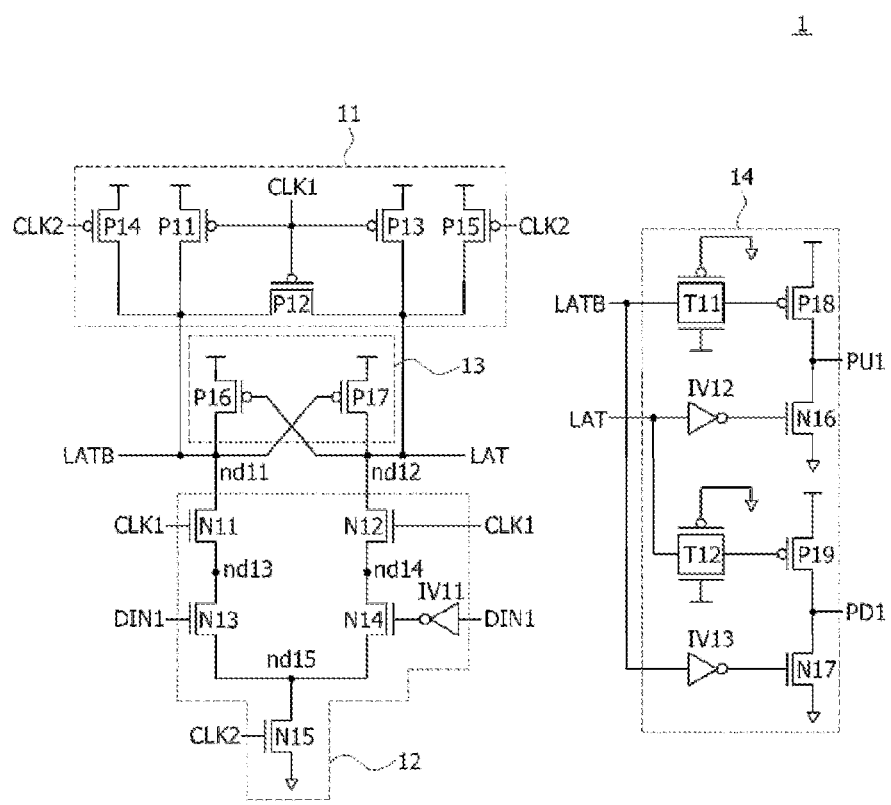
FIG. 2 is a circuit diagram illustrating a first drive control signal generator included in the serializer shown in FIG. 1.

Referring to FIG. 2, the first drive control signal generator 1 may be configured to include an initialization unit 11, a discharge unit 12, a charge supply unit 13 and a signal output unit 14.

The initialization unit 11 may include PMOS transistors P11, P12, P13, P14 and P15. The PMOS transistors P11, P12 and P13 may be turned on in response to the first clock signal CLK1 having a logic "low" level to initialize a node ND11 through which a complementary latch signal LATB is outputted and a node ND12 through which a latch signal LAT is outputted to a logic "high" level. The PMOS transistors P14 and P15 may be turned on in response to the second clock signal CLK2 having a logic "low" level to initialize the nodes ND11 and ND12 to a logic "high" level.

The discharge unit 12 may include NMOS transistors N11, N12, N13, N14 and N15. The NMOS transistor N11 may be coupled between the node N11 and a node ND13 and may be turned on in response to the first clock signal CLK1. The NMOS transistor N12 may be coupled between the node ND12 and a node ND14 and may be turned on in response to the first clock signal CLK1. The NMOS transistor N13 may be coupled between the node ND13 and a node ND15 and may be turned on in response to the first input data signal DIN1. The NMOS transistor N14 may be coupled between the node ND14 and the node ND15 and may be turned on in response to an output signal of an inverter IV11 receiving the first input data signal DIN1 as an input signal. The NMOS transistor N15 may be turned on in response to the second clock signal CLK2 to discharge the electric charges of the node ND15. While both of the first and second clock signals CLK1 and CLK2 have a logic "high" level, the discharge unit 12 may discharge the electric charges of the node ND11 or ND12 according to a logic level of the first input data signal DIN1 to set logic levels of the nodes ND11 and ND12. If the first input data signal DIN1 having a logic "high" level is inputted to the discharge unit 12, the electric charges of the node ND11 may be discharged more than the electric charges of the node ND12. Thus, a level of the node ND11 may be set to a logic "low" level and a level of the node ND12 may be set to a logic "high" level.

The charge supply unit 13 may include a PMOS transistor P16 that is connected to the node ND11 and is turned on according to a logic level of the node ND12 and a PMOS transistor P17 that is connected to the node ND12 and is turned on according to a logic level of the node ND11. That is, one of the PMOS transistors P16 and P17 may be selectively turned on according to logic levels of the nodes ND11 and ND12 to drive the nodes ND11 and ND12. If the first input data signal DIN1 having a logic "high" level is inputted to the discharge unit 12, the node ND11 may be set to have a logic "low" level and the node ND12 may be set to have a logic "high" level. Thus, the PMOS transistor P17 of the charge supply unit 13 may be turned on to supply electric charges to the node ND12. As a result, a voltage level of the node ND12 may be amplified. In contrast, if the first input data signal DIN1 having a logic "low" level is inputted to the discharge unit 12, the node ND11 may be set to have a logic "high" level and the node ND12 may be set to have a logic "low" level. Thus, the PMOS transistor P16 of the charge supply unit 13 may be turned on to supply electric charges to the node ND11. As a result, a voltage level of the node ND11 may be amplified.

The signal output unit 14 may selectively drive one of the first pull-up drive control signal PU1 and the first pull-down drive control signal PD1 according to the latch signal LAT and the complementary latch signal LATB. The signal output unit 14 may include transfer gates T11 and T12, inverters IV12 and IV13, PMOS transistors P18 and P19, and NMOS transistors N16 and N17. The PMOS transistor P18 may drive the first pull-up drive control signal PU1 to a logic "high" level in response to the complementary latch signal LATB transmitted through the transfer gate T11. The inverter IV12 may inversely buffer the latch signal LAT. The NMOS transistor N16 may drive the first pull-up drive control signal PU1 to a logic "low" level in response to an output signal of the inverter IV12. The PMOS transistor P19 may drive the first pull-down drive control signal PD1 to a logic "high" level in response to the latch signal LAT transmitted through the transfer gate T12. The inverter IV13 may inversely buffer the complementary latch signal LATB. The NMOS transistor N17 may drive the first pull-down drive control signal PD1 to a logic "low" level in response to an output signal of the inverter IV13.

Figure 3:
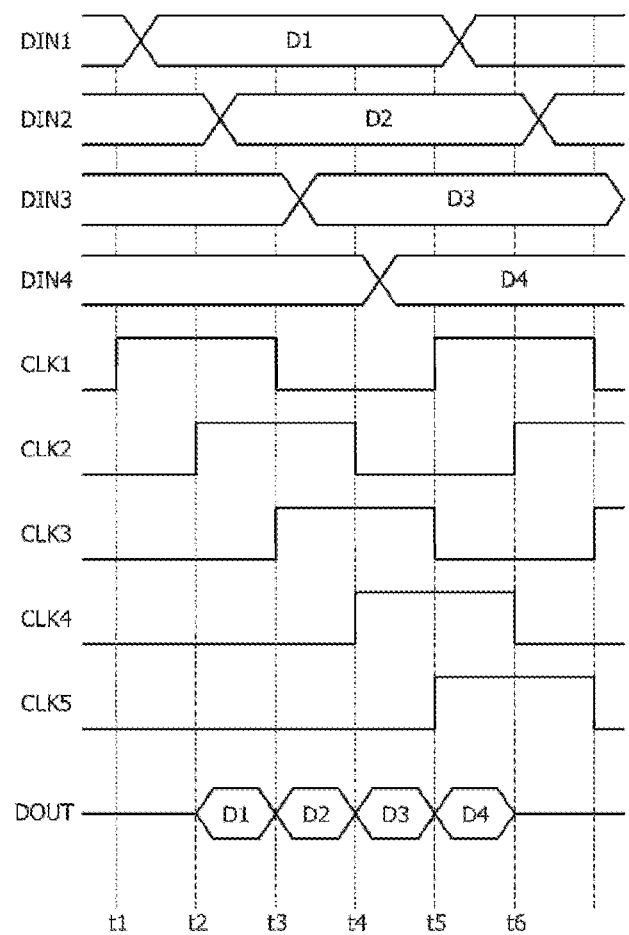
FIG. 3 is a timing diagram illustrating an operation of the serializer shown in FIG. 1.

An operation of the serializer having the aforementioned configuration will be described hereinafter with reference to FIG. 3.

If the first to fourth input data signals DIN1, DIN2, DIN3 and DIN4 are inputted in parallel in synchronization with the first to fifth clock signals CLK1, CLK2, CLK3, CLK4 and CLK5 during a period from a point of time "T1" till a point of time "T5", the serializer may generate the output data signal DOUT including output data which are driven in series. The serializer may amplify a first data D1 included in the first input data signal DIN1 to output the amplified first data D1 as the output data signal DOUT during a period between a point of time "T2" and a point of time "T3" that both of the first and second clock signals CLK1 and CLK2 have a logic "high" level. The serializer may amplify a second data D2 included in the second input data signal DIN2 to output the amplified second data D2 as the output data signal DOUT during a period between a point of time "T3" and a point of time "T4" that both of the second and third clock signals CLK2 and CLK3 have a logic "high" level. The serializer may amplify a third data D3 included in the third input data signal DIN3 to output the amplified third data D3 as the output data signal DOUT during a period between a point of time "T4" and a point of time "T5" that both of the third and fourth clock signals CLK3 and CLK4 have a logic "high" level. The serializer may amplify a fourth data D4 included in the fourth input data signal DIN4 to output the amplified fourth data D4 as the output data signal DOUT during a period between a point of time "T5" and a point of time "T6" that both of the fourth and fifth clock signals CLK4 and CLK5 have a logic "high" level.

Figure 4:
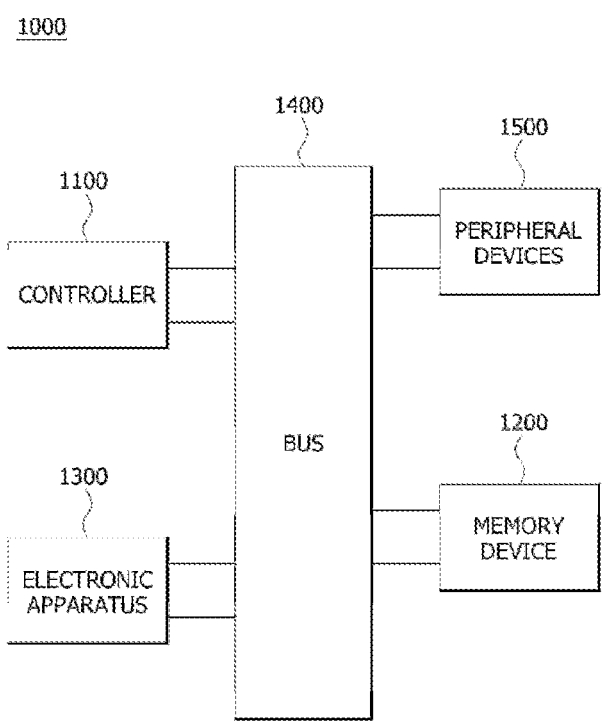
FIG. 4 is a block diagram of various features of an electronic system according to various embodiments of the description with regards to FIGS. 1-3 above.

As described above, a serializer according to an embodiment may sequentially amplify a plurality of data inputted in parallel in synchronization with clock signals having different phases from each other to generate an output data signal including a plurality of output data which are outputted in series. The serializer may amplify the plurality of input data to generate the output data signal whenever only two of the clock signals having different phases from each other have the same logic level. Thus, power consumption of the serializer may be reduced and an operation speed of the serializer may be improved Referring FIG. 4, an electronic system 1000 may include a controller 1100 and a memory device 1200. Memory device 1200 may be configured as a semiconductor integrated circuit, in accordance with embodiments taught herein, and may be similar to or identical to one or more of the embodiments discussed with respect to FIGS. 1-3. System 1000 may be formed in various ways such as coupling the individual components of system 1000 together or integrating the components into one or a number of chip-based units using conventional techniques. In an embodiment, system 1000 may also include an electronic apparatus 1300 and a bus 1400, where the bus 1400 provides electrical conductivity among the components of system 1000. In an embodiment, the bus 1400 includes an address bus, a data bus, and a control bus, each independently configured. In an alternative embodiment, the bus 1400 uses common conductive lines for providing one or more of address, data, or control, the use of which is regulated by controller 1100. In an embodiment, electronic apparatus 1300 may include additional memory for the intended functional applications of electronic system 1000. The memory device 1200 are not limited to, dynamic random access memory, static random access memory, synchronous dynamic random access memory (SDRAM), synchronous graphics random access memory (SGRAM), double data rate dynamic ram (DDR), and double data rate SDRAM, arranged according to the various embodiments as taught herein. The memory device 1200, in accordance with various embodiments as illustrated in FIGS. 1-3, may be realized in the read operation and the write operation using the test pads.

In various embodiments, peripheral device or devices 1500 are coupled to the bus 1400. Peripheral devices 1500 may include displays, imaging devices, printing devices, wireless devices, wireless interfaces (e.g. wireless transceivers), additional storage memory, control devices that may operate in conjunction with controller 1100. In an embodiment, controller 1100 may include one or more processors. In various embodiments, system 1100 includes, but is not limited to, fiber optic systems or devices, electro-optic systems or devices, optical systems or devices, imaging systems or devices, and information handling systems or devices such as wireless systems or devices, telecommunication systems or devices, and computers.

What is claimed is:

1. A serializer comprising:
 a first drive control signal generator suitable for amplifying a first input data signal in response to a first clock signal and a second clock signal to generate a first pull-up drive control signal and a first pull-down drive control signal; and a second drive control signal generator suitable for amplifying a second input data signal in response to the second clock signal and a third clock signal to generate a second pull-up drive control signal and a second pull-down drive control signal, wherein the first drive control signal generator includes an initialization unit suitable for receiving the first clock signal and the second clock signal to initialize a first node through which a latch signal is outputted and a second node through which a complementary latch signal is outputted.

2. The serializer of claim 1, wherein the first clock signal precedes the second clock signal by a set phase.

3. The serializer of claim 1, wherein the first clock signal precedes the second clock signal by a phase of about 90 degrees.

4. The serializer of claim 3, wherein the first drive control signal generator amplifies the first input data while the first and second clock signals have a predetermined logic level combination.

5. The serializer of claim 3, wherein the second clock signal precedes the third clock signal by a phase of about 90 degrees.

6. The serializer of claim 5, wherein the second drive control signal generator amplifies the second input data while the second and third clock signals have a predetermined logic level combination.

7. The serializer of claim 1, further comprising an output drive signal generator suitable for buffering the first pull-up drive control signal or the second pull-up drive control signal to generate an output pull-up drive signal, suitable for buffering the first pull-down drive control signal or the second pull-down drive control signal to generate an output pull-down drive signal, and suitable for latching the output pull-up drive signal and the output pull-down drive signal.

8. The serializer of claim 7, further comprising a driver suitable for driving an output data signal in response to the output pull-up drive signal and the output pull-down drive signal.

9. The serializer of claim 1, wherein the first drive control signal generator further includes a discharge unit suitable for receiving the first input data signal in response to the first clock signal and the second clock signal to discharge electric charges of the first node or the second node.

10. The serializer of claim 9, wherein the discharge unit selectively discharges the electric charges of one of the first node and the second node according to a logic level of the first input data signal while the first and second clock signals have a predetermined logic level combination.

11. The serializer of claim 9, wherein the first drive control signal generator further includes a charge supply unit suitable for selectively supplying electric charges to one of the first and second nodes according to logic levels of the first and second nodes.

12. The serializer of claim 11, wherein the first drive control signal generator further includes a signal output unit suitable for outputting the first pull-up drive control signal and the first pull-down drive control signal, any one of which is selectively driven according to logic levels of the latch signal and the complementary latch signal.

13. The serializer of claim 1, wherein the first drive control signal generator comprises:

an initialization unit suitable for receiving the first clock signal and the second clock signal to initialize a first node through which a latch signal is outputted and a second node through which a complementary latch signal is outputted;

a discharge unit suitable for receiving the first input data signal in response to the first clock signal and the second clock signal to discharge electric charges of the first node or the second node; and a charge supply unit suitable for selectively supplying electric charges to one of the first and second nodes according to logic levels of the first and second nodes.

14. A serializer comprising:

an initialization unit suitable for receiving a first clock signal and a second clock signal to initialize a first node through which a latch signal is outputted and a second node through which a complementary latch signal is outputted;

a discharge unit suitable for receiving an input data signal in response to the first clock signal and the second clock signal to discharge electric charges of the first node or the second node; and a charge supply unit suitable for selectively supplying electric charges to one of the first and second nodes according to logic levels of the first and second nodes, wherein the discharge unit selectively discharges electric charges of one of the first node and the second node according to a logic level of the input data signal while the first and second clock signals have a predetermined logic level combination.

15. The serializer of claim 14, wherein the first clock signal precedes the second clock signal by a phase of about 90 degrees.

16. The serializer of claim 14, further comprising a signal output unit configured for outputting a pull-up drive control signal and a pull-down drive control signal, any one of which is selectively driven according to logic levels of the latch signal and the complementary latch signal, wherein the pull-up drive control signal and the pull-down drive control signal are generated to selectively drive an output data signal.

17. A serializer comprising:

an initialization unit configured for receiving a first clock signal and a second clock signal to initialize a first node through which a latch signal is outputted and a second node through which a complementary latch signal is outputted; and a signal output unit configured for outputting a pull-up drive control signal and a pull-down drive control signal, any one of which is selectively driven according to logic levels of the latch signal and the complementary latch signal, wherein the pull-up drive control signal and the pull-down drive control signal are generated to selectively drive an output data signal.

18. The serializer of claim 17, wherein the first clock signal precedes the second clock signal by a set phase.

19. The serializer of claim 17, further comprising an output drive signal generator suitable for buffering the pull-up drive control signal to generate an output pull-up drive signal, suitable for buffering the pull-down drive control signal to generate an output pull-down drive signal, and suitable for latching the output pull-up drive signal and the output pull-down drive signal.

20. The serializer of claim 19, further comprising a driver suitable for driving an output data signal in response to the output pull-up drive signal and the output pull-down drive signal.

* * * * *